United States Patent [19]

Hayashi

[11] Patent Number: 4,901,204
[45] Date of Patent: Feb. 13, 1990

[54] SECURING UNIT FOR SECURELY MOUNTING PRINTED CIRCUIT BOARDS RELATIVELY MOVABLE BETWEEN TWO POSITIONS

[75] Inventor: Yoshitoki Hayashi, Aichi, Japan

[73] Assignee: Kitagawa Industries Co., Ltd., Nagoya, Japan

[21] Appl. No.: 188,066

[22] Filed: Apr. 27, 1988

Related U.S. Application Data

[63] Continuation of Ser. No. 45,773, Apr. 30, 1987, abandoned, which is a continuation of Ser. No. 902,027, Aug. 25, 1986, abandoned, which is a continuation of Ser. No. 617,520, Jun. 5, 1984, abandoned.

[30] Foreign Application Priority Data

Jun. 28, 1983 [JP] Japan ................. 58-116397

[51] Int. Cl.[4] .............................. H05K 7/02
[52] U.S. Cl. ..................... 361/417; 24/297; 24/326; 24/453; 174/138 D; 361/412; 361/419; 361/420
[58] Field of Search .......... 24/297, 326, 453; 176/138 DX; 211/411; 248/1; 361/396, 412, 413, 417, 419-420; 411/508-510

[56] References Cited

U.S. PATENT DOCUMENTS

| | | | |
|---|---|---|---|
| 3,651,545 | 3/1972 | Hara | 174/138 D |
| 3,777,052 | 12/1973 | Fegen | 411/408 X |
| 3,811,154 | 5/1974 | Lindeman et al. | 24/326 |
| 3,836,703 | 9/1974 | Coules | 411/508 X |
| 3,893,208 | 7/1975 | Yuda | 174/138 D X |
| 3,909,883 | 10/1975 | Fegen | 411/508 X |
| 4,161,017 | 7/1979 | Pierce et al. | 361/412 |
| 4,200,900 | 4/1980 | McGeorge | 174/138 D X |
| 4,261,151 | 4/1981 | Ito | 24/523 X |
| 4,297,769 | 11/1981 | Coules | 174/138 D |
| 4,373,826 | 2/1983 | Inamoto et al. | 24/297 X |
| 4,422,222 | 12/1983 | Notoya | 411/508 X |
| 4,470,178 | 9/1984 | Matsui | 174/138 D |
| 4,473,204 | 9/1984 | Böhm | 174/138 D |
| 4,527,312 | 7/1985 | Ruehl et al. | 174/138 D |

FOREIGN PATENT DOCUMENTS

| | | |
|---|---|---|
| 0033850 | 8/1981 | European Pat. Off. . |
| 2616333 | 11/1977 | Fed. Rep. of Germany . |
| 2901213 | 7/1980 | Fed. Rep. of Germany . |
| 48-16063 | 5/1973 | Japan . |
| 49-19261 | 2/1974 | Japan . |
| 616219 | 1/1949 | United Kingdom . |
| 949994 | 2/1964 | United Kingdom . |
| 1271400 | 4/1972 | United Kingdom . |
| 1541448 | 2/1979 | United Kingdom . |
| 1567441 | 5/1980 | United Kingdom . |
| 1578381 | 11/1980 | United Kingdom . |

Primary Examiner—Gregory D. Thompson
Attorney, Agent, or Firm—Oblon, Spivak, McClelland, Maier & Neustadt

[57] ABSTRACT

A two-part securing unit wherein the interconnection of the two parts is assured once they are assembled. The securing is useful in securely fixing at least two printed circuit boards in parallel relation, the securing unit being attachable to a chassis or to another form of fixed plate. The two parts of the securing unit are relatively pivotable, whereby the outermost board may be moved to an open state to allow easy repair or inspection. The securing unit is capable of holding the two plates rigidly in the open state, such that repair or inspection may proceed without the necessity of manually supporting the outermost board in its open state.

8 Claims, 8 Drawing Sheets

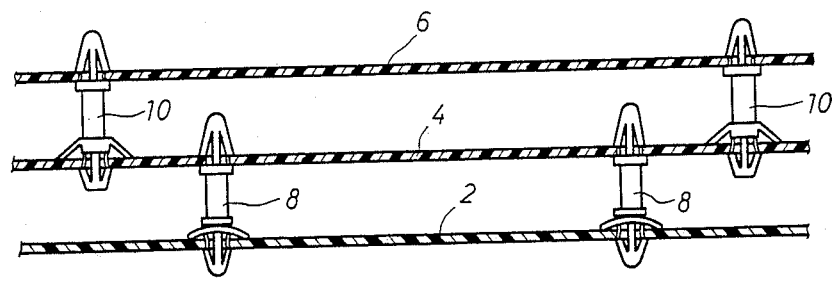
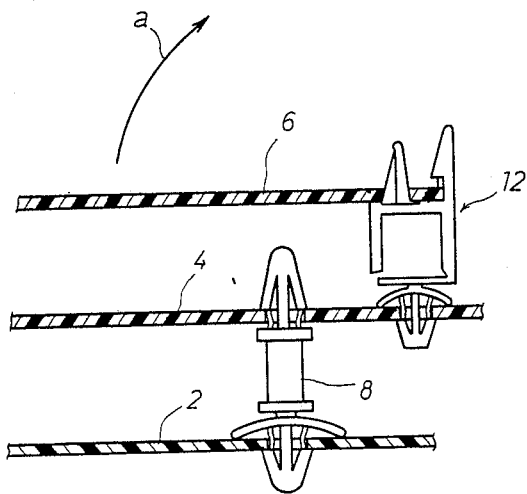
Fig. 1
PRIOR ART
Fig. 2
PRIOR ART

SECURING UNIT FOR SECURELY MOUNTING PRINTED CIRCUIT BOARDS RELATIVELY MOVABLE BETWEEN TWO POSITIONS

This application is a continuation of application Ser. No. 07/045,773, filed on Apr. 30, 1987, now abandoned, which is a continuation of Ser. No. 06/902,027 filed Aug. 25, 1986, which is a continuation of 06/617,520 filed on Jun. 5, 1984 now abandoned.

BACKGROUND OF THE INVENTION (1) Field of the Invention

The invention relates to a securing unit for use in mounting at least two printed circuit boards and for holding the boards in different holding states such as a closed state in which the boards are adjacent and parallel and an open state in which one board is moved away and held at an angle with respect to the other board. The invention is especially useful in electronic apparatus in which two substrates are mounted to a stationary member such as a chassis and are normally held in the closed state but in which easy access may be had to one or both boards by moving them to the open state.

(2) Description of the Background

In the prior art as illustrated in FIG. 1, in order to mount boards 4 and 6, such as wiring boards, to a stationary board or a fixing board, such as chassis 2, with predetermined distances therebetween, a plurality of securing units 8, 10 as shown in FIG. 1 have been used. However, with these securing units it was difficult to remove the upper board 6 from the board 4 for maintenance work or for repair work. Furthermore, the board 6 normally is electrically connected with the board 4 by lead wires such that, during repair or inspection of the boards, the board 6 must be held by hand so as not to disengage the electric interconnection. The necessity of holding the board 6 by hand diminishes the efficiency of repair and inspection.

In order to overcome the disadvantages mentioned above, another securing unit 12 has been known in the prior art as shown in FIG. 2. Securing unit 12 has hinge means as shown and is used in place of the securing unit 10 as shown in FIG. 1. Although this securing unit 12 allows the board 6 to achieve two different positions when board 6 is moved in the direction of the arrow marked a, i.e., the securing unit 12 permits the board 6 to swing in the direction a, the position of the board 6 after being moved can not be fixed unless it is retained or held by hand, thus making the position of the board 6 unstable and also making the maintenance or repairing work difficult to carry out. This means that the problems encountered in the prior art according to FIG. 1 remain unsolved by the other securing unit 12 according to the prior art of FIG. 2.

SUMMARY OF THE INVENTION

It is therefore a main object of the present invention to overcome the above problems and provide a securing unit for use in mounting at least two boards such as wiring boards on a stationary board such as a chassis with predetermined distances therebetween, for holding the boards in the closed state, and for holding the boards in the open state without the aid of a human hand.

It is another object of the present invention to provide a securing unit having a holding portion to be fixed on a stationary board and a mounting portion which is pivotally coupled with the holding portion, in which a stopper is provided on at least one of the holding portion or the mounting portion or on both, as the case may be, which stopper is capable of retaining the outer board, when it is moved to the open state, at a suitable position by restricting the range of the opening and closing movement or the angle of the swing of the board from the closed condition to the fully opened condition.

It is a still further object of the present invention to provide a securing unit having a holding portion coupled to a mounting portion through coupling means in which one of two boards i.e., the outer board can be retained by stopper means of the securing unit itself after the boards have been opened by pivotal movement around the coupling means, such that repair or maintenance work can effectively be performed by one person by virtue of a stable opened condition of the outer board, without the necessity of retaining it by human hand or hands.

One of the features of the securing unit according to the present invention resides in that the securing unit comprises a holding portion including a bottom plate having a suitable thickness, a plate coupling member extending from one end of the upper surface of the bottom plate perpendicular to the upper surface having shaft means disposed thereon, and pin projections in the vicinity of the shaft means. A first mounting member is disposed on the bottom plate and has at least one resilient detent member for mounting a first. Fixing means are provided at the bottom surface of the bottom plate for mounting or, fixing the holding portion on the stationary board. The securing unit further comprises a mounting portion including an arm portion having grip members and a groove extending to centrally from the lower ends of the grip members, into which the top end of plate coupling member is inserted. An axial hole and pin hole are formed generally at the center of the grip members. A tapered stopper means is formed at the ceiling of the groove, and a second mounting member is provided at the distal end of the arm portion for mounting a second board thereon. The mounting portion is engaged by the coupling portion of the holding member by inserting top end edge of the plate coupling member of the holding portion into the groove of the mounting portion by fitting the shaft means into the hole of the mounting portion. The second board can be held in the open state by the stopper means after it has been pivotally moved until it is stopped by the stopper means.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein:

FIG. 1 is an elevation of securing units according to the prior art, mounting a plurality of boards shown in cross-section, FIG. 2 is an elevation of different types of securing units according to the prior art, mounted to a plurality of boards shown in cross-section.

DESCRIPTION OF THE PREFERRED EMBODIMENT

Figure 3:
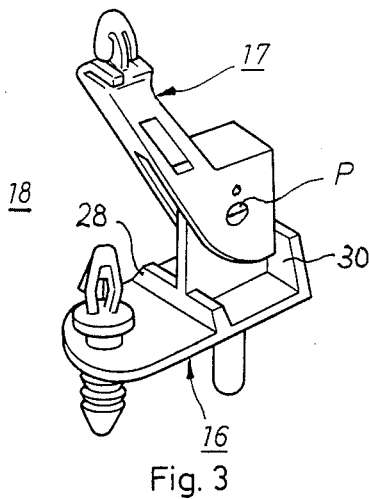
FIG. 3 is an overall perspective of a securing unit according to the present invention.

Referring to FIG. 3, there is shown a securing unit 18 according to the present invention which basically comprises: a holding portion 16 to be fixed on a stationary board such as a base plate made of, and being instance, wood used in an electric organ or the like, and a mounting portion 17 which is pivotally coupled with the holding portion by pivotal means P on the holding portion.

Figure 4:
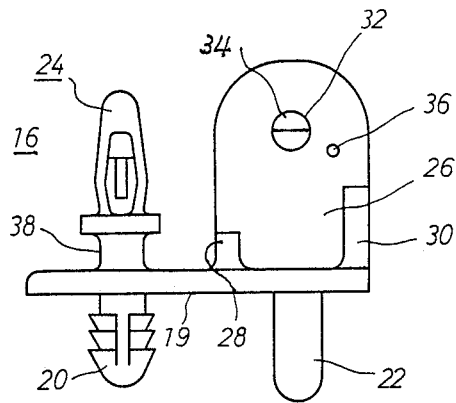
FIG. 4 is a front elevation of the holding portion of the securing unit shown in FIG. 3.
Figure 5:
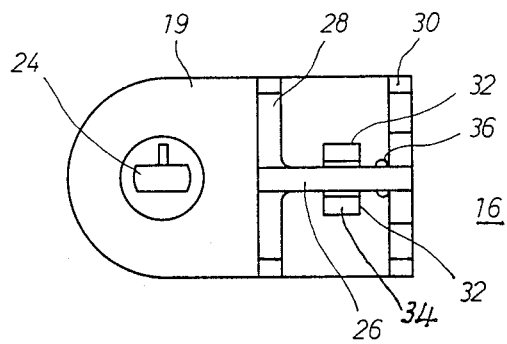
FIG. 5 is a top view of the holding portion of the securing unit of FIG. 3.

As shown in more detailed elevational and plan views of FIGS. 4 and 5, the holding portion 16 comprises a bottom plate 19, a detent member 20 having stepped portions, and a projection 22 for preventing the rotational movement of the securing unit when mounted on a stationary plate or a fixing board, not shown here. Detent member 20 and projection 22 are provided on the bottom surface of the bottom plate 19. The detent member 20 serves as a fixing member of the securing unit 16 when inserted into a mounting hole formed on the stationary plate and fixed thereon. The detent member 20 will be discussed in more detail later.

The holding portion 16 also comprises on the upper surface thereof, a first mounting member 24 for mounting a first board (73 in FIG. 12) and a plate coupling member 26 pivotally coupled with the mounting portion 17. Namely, FIGS. 4 and 5 show the securing unit 18, with the mounting portion 17 being removed from the unit. The plate coupling member 26 is of predetermined width and thickness, and the front and rear edges are reinforced by ribs 28 and 30, respectively. A shaft means 32 extends a predetermined distance from each side of the plate coupling member 26, so as to prevent the separation of the mounting portion 17, from the plate coupling member 26.

A pair of pin projections 36 are formed on each side surface of the plate coupling member 26 and serve as stop members.

Figure 6:
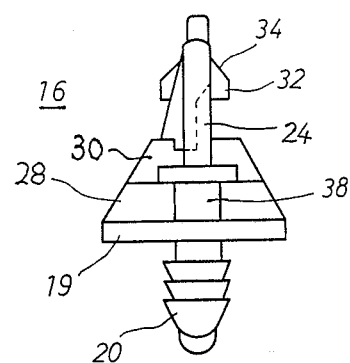
FIG. 6 is a left elevation of the holding member of securing unit of FIG. 3.

FIG. 6 shows a left-side elevation of the holding portion 16 having the detent member 20 and the first mounting member 24 respectively formed on the bottom and top surfaces of the bottom plate 19.

Figure 7:
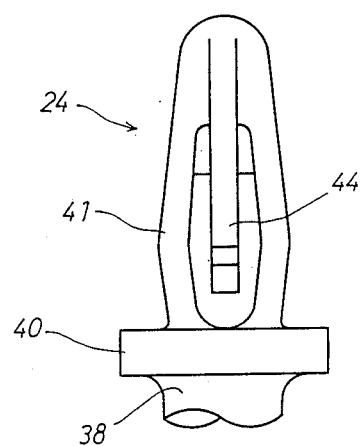
FIG. 7 is an enlarged front elevation of the first mounting member of the securing unit shown in FIG. 3.
Figure 8:
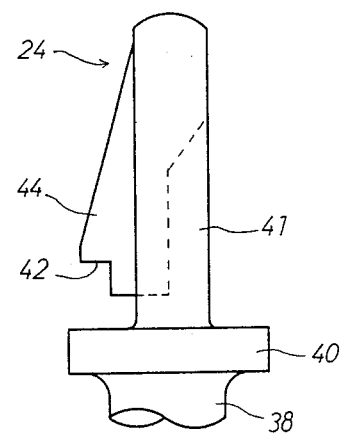
FIG. 8 is an enlarged left elevation of the first mounting member of the securing unit shown in FIG. 3.

FIG. 7 shows an enlarged front elevation of the first mounting member 24, and FIG. 8 shows an enlarged left elevation of the first mounting member 24. As shown in the figures, the first mounting member 24 has a pedestal 40 formed on a supporting member 38. On the pedestal 40 there is provided a resilient frame member 41, which has a resilient detent member 44. The resilient detent member 44 has a downwardly inclined edge plate portion having a notch 42 at the bottom end thereof. When the first mounting member 24 is inserted into a mounting hole of the first board (not shown), the resilient frame member 41 is deformed during its passage through the hole and then resiliently restores its original shape. The first board therefore is fixed by the frame member 41 and the notch 42, with the movement of the upper surface of the board being restricted by the notch 42. All the components of the holding portion 16, according to the present invention, may be integrally formed as one piece.

Figure 9:
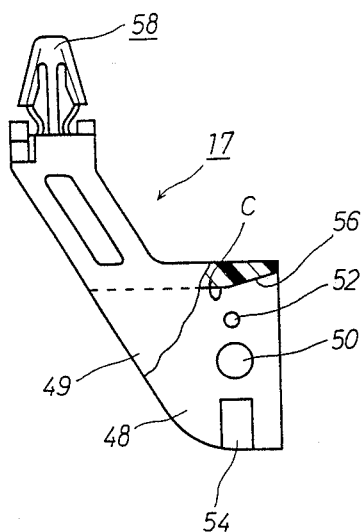
FIG. 9 is a front elevation, partially cut-away, of the mounting portion of the securing unit shown in FIG. 3.
Figure 10:
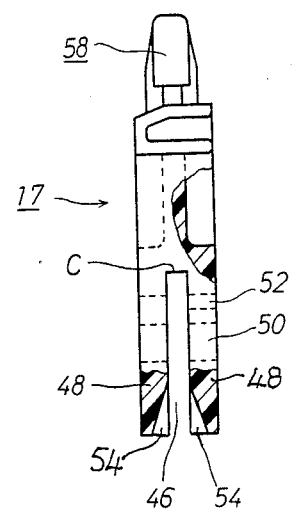
FIG. 10 is a left elevation of the mounting portion of the securing unit shown in FIG. 3.

FIGS. 9 and 10 respectively show partially cut-away front and left elevations of the mounting portion 17. A groove 46 extends from the bottom end of the mounting portion 17 as shown in FIG. 10. The width of the groove 46 is substantially equal to or slightly larger than the thickness of the plate coupling member 26 of the holding portion 16 so as to permit the plate coupling member 26 to be fitted into the groove 46 with a sufficient resiliency but without producing any backlash, while the holding portion 26 is mounted on a first board. An axial hole 50 extends centrally through the mounting portion 17, from one side surface to the other. The presence of the groove 46 partially divides the arm 49 of mounting portion 17 into two grip members 48. This axial hole 50 serves to permit a pivotal movement of the mounting portion 17 around the axial hole when the shaft means 32 (FIGS. 4 and 5) of the plate coupling member 26 is fitted thereto.

Just above the axial hole 50, there is formed a smaller hole 52 into which the pin projections 36 (See FIGS. 4 and 5) are inserted when the hole 52 is registered with the pin projections 36 of the holding portion 16.

On the bottom edge of each grip member 48, is formed a tapered notch in the opposite sidewalls of groove 46 so as to permit the easy insertion of the plate coupling member 26 of the holding member 16 into the gap 46. As a further aid in assembly, the upper portions of shafts 32 may be tapered as shown to form ramps 34 for temporarily displacing outwardly the grip members 48.

Moreover, stopper means 56 comprises a taper 56 in the ceiling C at the top of the groove 46. The tapered ceiling serves as a stopper when the mounting portion 17 is pivotally moved around the axial hole 50 and contacts an end surface of the plate coupling member 26 of the holding portion 16; subsequent to assembly of the two elements. On the other end of the mounting portion 17, there is provided a second mounting member 58.

Figure 11:
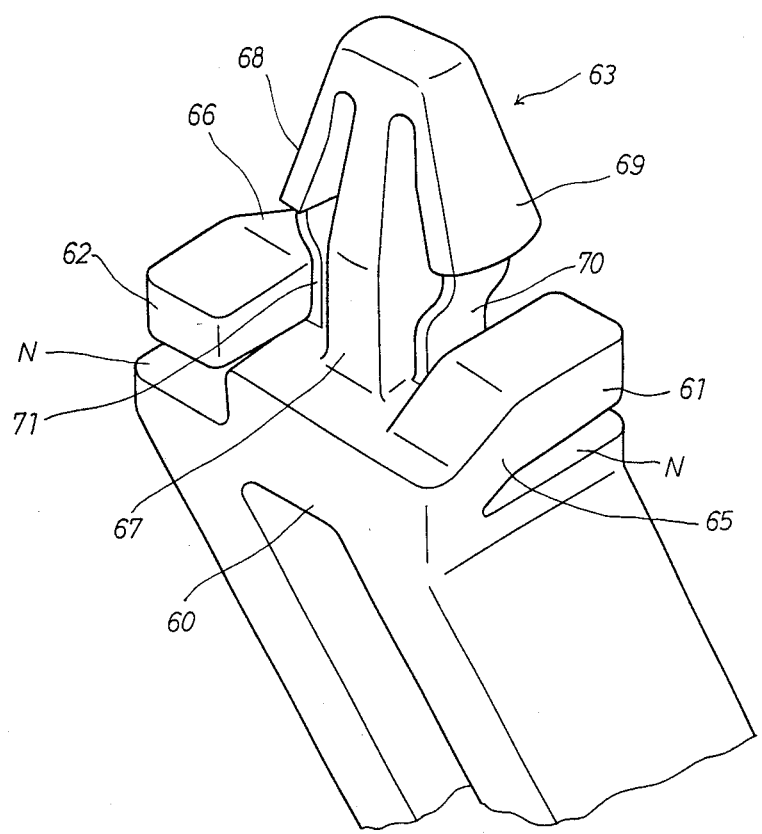
FIG. 11 is an enlarged perspective of the top of the mounting portion and illustrating the second mounting member in detail.

FIG. 11 shows an enlarged perspective view of the second mounting member 58. The second mounting member 58 comprises a generally rectangular pedestal 60, an arrow-shaped head portion 63 having a center support 67, a pair of resilient detent members 68, 69, and thin linkage member 70, 71, which connect the bottom portions of the detent members 68, 69 and the pedestal 60. The components of the second mounting member 58 are all integrally formed as one piece. The linkage members 70, 71 can be resiliently deformed inwardly when any pushing force is applied thereto. Moreover, a pair of resilient pushing members 61, 62 are formed on the pedestal 60 and resilient supported by arms 668 thereby respectively forming a notch N on opposite sides of the pedestal.

Figure 12:
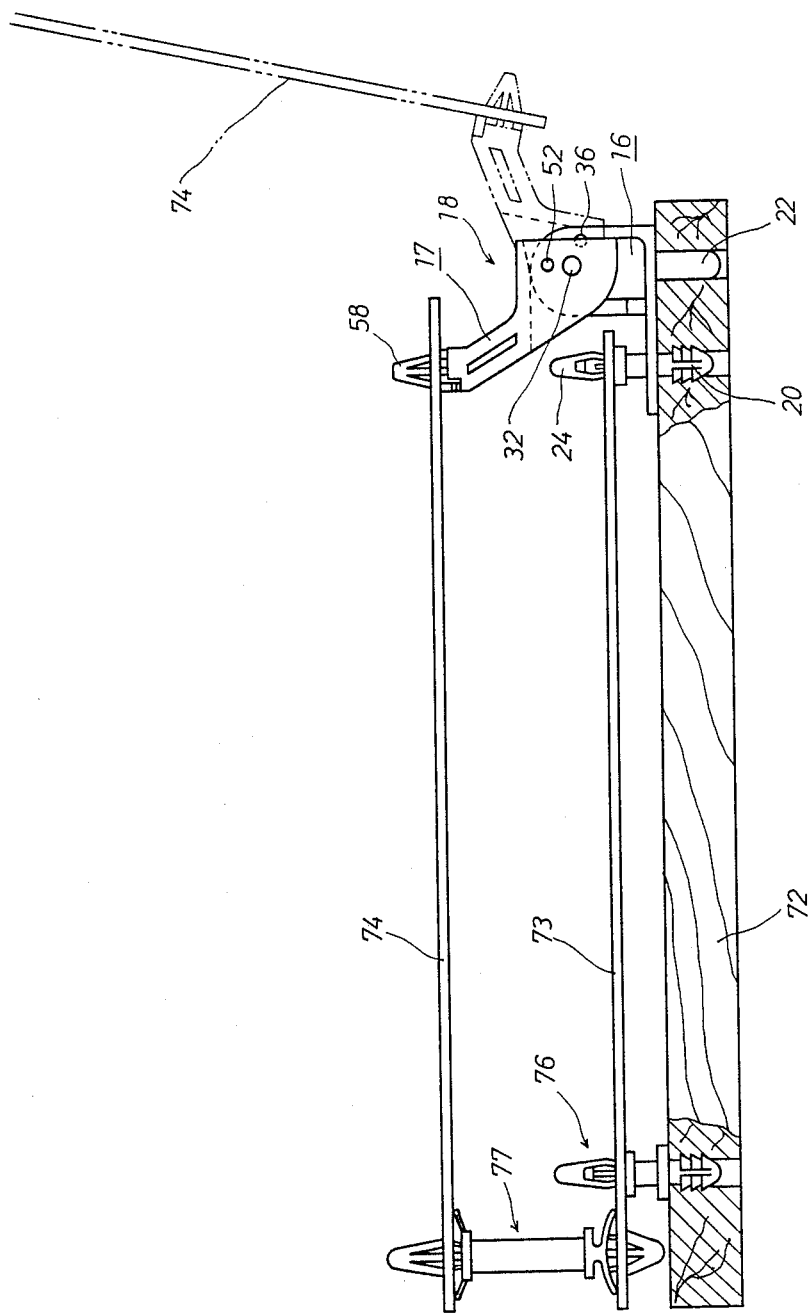
FIG. 12 is a front elevation of the securing unit according to the present invention, mounted on a partially sectioned fixing board together with other securing units the closed state of the boards being shown in solid line and the open state in phantom.

With reference to FIG. 12, when the second mounting member 58 is inserted into a mounting hole of a second mounting board 74, the resilient detent member 68, 69 are deformed inwardly, as are the linkage members 70, 71. Following insertion, the resilient detent members 68, 69 are resiliently restored to their original positions, wherein their respective bottom ends engage the upper peripheral surface of the board 74 adjacent the mounting hole therein. In this configuration, the resilient pushing members 61, 62 push upwardly on the bottom surface of the board. Accordingly, the second mounting member 58 as described above securely fixed the second board 74 is supported from above by the detent members 68, 69, from below by the resilient pushing members 61, 62 and laterally by the linkage members 70, 71.

FIG. 12 shows the securing unit 18, according to the present invention, fixed to a stationary board 72. Securing unit 18 supports first and second mounting boards 73, 74 such as wiring boards, with the assistance of a conventional securing unit 77 as shown in FIG. 1 or 2 as a fastener similar to the first mounting member 24 of the holding portion 16 of the securing unit according to the present invention.

Namely, the securing unit 18 according to the present invention is mounted and fixed on one end of the stationary board 72 by inserting into the holes of the stationary board the detent projection 20 and member 22 for preventing rotational movement of the holding portion. First and second boards 73, 74 are mounted in parallel at a predetermined spacing by in co-operation of the securing unit 18 with a fastener 77 according to the prior art and the mounting means 76. More particularly, the mounting means 76 co-operates with the first mounting member 24 of the securing unit 18 for mounting the first board 73. The fastener 77, according to the prior art, is substantially sandwiched between the first board 73 and the second board 74, and it co-operates with the second mounting member 58 to mount the second board 74.

The fastener 77 according to the prior art also has a pair of resilient detent members and a resilient pushing member provided at both ends thereof. Accordingly, when it is desired to release, for instance, the second board 74 from the securing unit 77, the pair of resilient detent members provided at the upper portion of the unit 77 is inwardly pushed and deformed by hand, then the second board 74 can be removed from the securing unit 77.

The second board 74, thus released at one end thereof, can be pivotally moved around the axis of shaft means 32 of the plate coupling member of the securing unit 18 according to the present invention, and it can be retained in the opened condition as shown in the chain line 74 in FIG. 12. In this opened condition, the tapered surface of the stopper means (FIG. 9) abuts the end surface of the plate coupling member 26 that is reinforced by the rib 30 to lock the position of the mounting portion 17 in the opened state thereof. Therefore, the mounting portion 17 is capable of securely holding the second board 74 open and inclined with respect to vertical.

Furthermore, in the opened condition the pin projections 36 (FIGS. 4 and 5) enter the smaller holes 52 of the grip members 48, thereby affirmatively securing the position of the second board 74 in the opened condition. In this case, the pin projections 36 shown in FIG. 4 are fitted into the hole 52 shown in FIG. 9 after resiliently expanding the groove 46 between the grip members 48, 48. Accordingly, the second board 74 cannot easily come off from accidental external shocks or vibrations applied thereto during the repairing work or maintenance work, and it is kept opened at a predetermined position.

Accordingly, the second board 74 can be retained in the stable opened condition even if the two boards are electrically wired at the right side, when opened as mentioned above. Furthermore, no backlash is produced when the second board 74 is opened or closed as the plate coupling member 26 of the holding portion 16 having its top end inserted into the mounting portion 17 is strongly gripped by the grip members 48, 48 resiliently.

In addition, in the securing unit according to the present invention, since it is not necessary to hold the second board 74 by hand after it has been opened as shown in the chain line 74 in FIG. 12, the repairing work or maintenance work can be performed effectively by one person by use of both hands.

In the foregoing embodiment according to the present invention, the stationary board is shown as being made of wood. However, as mentioned at the beginning of the description, a stationary board such as a chassis can be used in lieu of the wooden board. In that case, any suitable fixing means must be of course used instead of the detent member 20 and the projection 22 of the holding portion 16.

Figure 13:
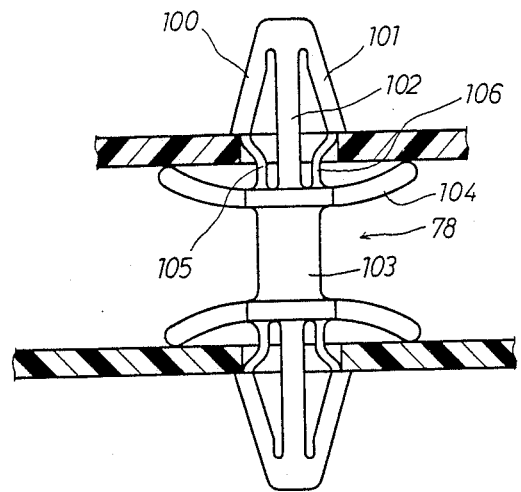
FIG. 13 is an elevational view of a different prior art securing unit which may be used together with the securing unit according to the present invention for mounting to a board instead of a chassis.

FIG. 13 shows another fastener 78 according to the prior art which comprises a pair of resilient detent members 100, 101, provided at both sides of a center pillar member 102, which stands on a support member 103 being provided with a resilient pushing member 104. Thin linkage strip members 105, 106 are connected between the bottom edges of the pair of the resilient detent members and the support member respectively on both ends of the support member 103. The fastener 78 shown in FIG. 13 is almost the same as that shown in FIG. 12 except for the length of the support member 103.

Figure 14:
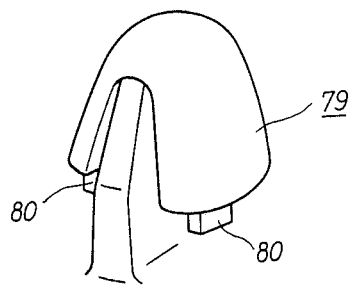
FIG. 14 is an enlarged perspective of still another type of fastener according to the present invention for mounting to a chassis.
Figure 15:
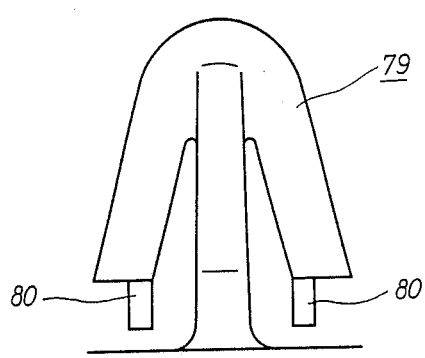
FIG. 15 is an enlarged front elevation of the fastener of FIG. 14.
Figure 16:
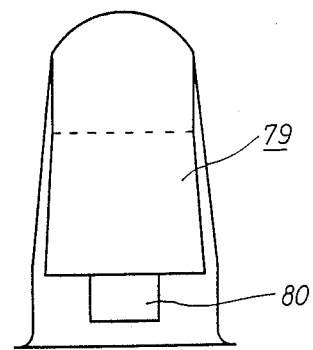
FIG. 16 is an enlarged side elevation of the fastener of FIG. 14.

FIG. 14 to 16 show respectively an enlarged perspective, an enlarged side elevation, and an enlarged elevation of another type of fastener used for mounting to a chassis instead of a wooden plate. In this embodiment, the arrow like head portion comprises a pair of smooth curved resilient detent members 79 with projections 80, 80 at each bottom edge of the resilient detent members, all being integrally formed as one piece, as in the case of the foregoing embodiments according to the present invention.

Moreover, in the forgoing embodiments according to the present invention, the groove 46 extends from the lower end surface of grip members 48 of the mounting portion 17 of the securing unit. However, it is also possible to form the groove in the plate coupling member side of the holding portion 16 instead of providing it at the mounting portion as described in the forgoing embodiments.

As described in the forgoing, the securing unit having the holding portion, the mounting portion, and coupling portion, can be mounted on a stationary board, and it can mount a plurality of mounting boards, such as wiring boards, spaced apart at a predetermined distance so that one side of the outer board 74 may be released, moved pivotally, and retained in the opened condition of the second board without the use of a human hand or hands, due to the stopper means of the securing unit according to the present invention.

Since the second board, which has been opened, can be retained by the stopper means of the securing unit itself, repairing or maintenance work can effectively be performed by one person in a stable condition of the outer board without substaining it by a human hand or hands.

While the invention has been described in its preferred embodiments, it is to be understood that the words which have been used are words of description rather than limitation and that various changes and modifications may be made within the purview of the appended claims without departing from the true scope and spirit of the invention in its broader aspects.

What is claimed is:

1. A securing unit which holds a first board at a predetermined distance from a fixed board and movably mounts a second board such that said second board is movable between open and closed states with respect to said first board, comprising:
    a bottom plate;
    fastening means extending from a first surface of said bottom plate and fixing said bottom plate on said fixed board;
    a first mounting member extending from a second surface of said bottom plate and comprising means securely mounting said first board with respect to said bottom plate;
    a coupling plate extending from said second surface of said bottom plate;
    a mounting portion comprising a second mounting member, said second mounting member comprising elastic detent means engaging said second board and securely mounting said second board on said mounting portion;
    pivotal mounting means pivotally mounting said mounting portion on said coupling plate such that said mounting portion is pivotable so as to move said second board between said open and closed states; and
    stopper means restricting the range of pivotal movement of said mounting portion.

2. A securing unit as claimed in claim 1, further comprising means formed on said coupling plate and said mounting portion preventing said mounting portion from coming off of said coupling plate in response to shocks and vibrations.

3. A securing unit as claimed in claim 1, wherein said pivotal mounting means comprises:
    a groove formed in said mounting portion and receiving said coupling plate therein;
    shaft means extending from opposite surfaces of said coupling plate; and
    through-holes formed in said mounting portion and receiving said shaft means.

4. A securing unit as claimed in claim 3, further comprising a tapered surface formed on said mounting portion at a closed end of said groove, said tapered surface comprising said stopper means restricting the pivotal movement of said mounting portion in one direction.

5. A securing unit as claimed in claim 5, wherein said mounting portion further comprises tapered notches adjacent an open end of said groove and facilitating assembly of said securing unit.

6. A securing unit as claimed in claim 1, including a rib in the form of a rigid planar wall extending from an edge of said second surface of said bottom plate, perpendicular to and connected to said coupling plate.

7. A securing unit as claimed in claim 1, wherein said second board is substantially parallel to said first board in said closed state thereof and said second board forms an angle with said first board in said open state thereof,
    said stopper means comprising a rib having a side surface and an end surface,
    said mounting portion having a planar end surface for abutting said side surface of said rib when said second board is in said closed state and for abutting said end surface of said rib when said second board is in said open state.

8. A securing unit as claimed in claim 7, further comprising means preventing said mounting portion from coming off of said coupling plate in response to shocks and vibrations, said prevent means comprising pins projecting from opposite surfaces of said coupling plate and pin receiving holes formed in said mounting portion, said pins being engageable with said pin receiving holes when said second board is in said open state.

* * * * *